United States Patent
Baba

(10) Patent No.: US 6,476,429 B2
(45) Date of Patent: Nov. 5, 2002

(54) SEMICONDUCTOR DEVICE WITH BREAKDOWN VOLTAGE IMPROVED BY HETERO REGION

(75) Inventor: Yoshiro Baba, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/832,208

(22) Filed: Apr. 11, 2001

(65) Prior Publication Data

US 2002/0008258 A1 Jan. 24, 2002

(30) Foreign Application Priority Data

Apr. 12, 2000 (JP) ........................... 2000-111039

(51) Int. Cl.[7] .............................................. H01L 29/80
(52) U.S. Cl. ................. 257/273; 257/133; 257/137; 257/152; 257/168; 438/92; 438/93; 438/483; 438/518
(58) Field of Search ................. 257/133, 137, 257/152, 168; 438/92, 93, 483, 518

(56) References Cited

U.S. PATENT DOCUMENTS 6,054,728 A * 4/2000 Harada et al. ............... 257/133
6,100,111 A * 8/2000 Konstantinov ............... 438/483

FOREIGN PATENT DOCUMENTS

JP         9-191109         7/1997

* cited by examiner

Primary Examiner—David Nelms
Assistant Examiner—Mai-Huong Tran
(74) Attorney, Agent, or Firm—Oblon, Spivak, McClelland, Maier & Neustadt, P.C.

(57) ABSTRACT

A power MOSFET includes an $n^-$-drain layer, a drain contact layer disposed on a first side of the drain layer, a p-type base layer disposed on a second side of the drain layer, and an n-source layer disposed on the base layer. A gate electrode faces, through a gate insulating film, a channel region, which is part of the base layer between the drain and source layers. Source and drain electrodes are electrically connected to the source and drain contact layers, respectively. A plurality of hetero regions having a dielectric constant higher than that of the drain layer is disposed in the drain layer between the source and drain electrodes.

20 Claims, 1 Drawing Sheet

SEMICONDUCTOR DEVICE WITH BREAKDOWN VOLTAGE IMPROVED BY HETERO REGION

CROSS-REFERENCE TO RELATED APPLICATIONS

This application is based upon and claims the benefit of priority from the prior Japanese Patent Application No. 2000-111039, filed Apr. 12, 2000, the entire contents of which are incorporated herein by reference.

BACKGROUND OF THE INVENTION

The present invention relates to a semiconductor device and a manufacturing method thereof, and more particularly to a MIS (Metal Insulator Semiconductor) FET (Field Effect Transistor) including a power MOS (Metal Oxide Semiconductor) FET, which is required to have a high breakdown voltage.

In recent years, market forces have demanded that power MOSFETs used in invertors for electrical vehicles (EV) and the like be more compact, less energy-consuming, and less expensive.

In the field of MOSFETs subjected to such requirements, a MOSFET having a structure shown in FIG. 3 is known as one which can solve the problem of trade-off between the breakdown voltage and the ON-resistance of the device. This device includes an n-drain layer 101, which has p-embedded epitaxial layers 102 arrayed in multi stages. With this arrangement, the n-drain layer 101 decreases its resistance. Further, the n-drain layer 101 and the p-layers 102 are completely depleted by expansion of depletion layers from pn junctions between the p-layers 102 and the n-layer 101, in a reverse bias state (RESURF (REduced SURface Field) principle.

Other than this structure, similar structures have been proposed, such as one having diffusion layers called p-pillar/n-stripe formed in an n-drain layer. These structures are constituted on the basis of the following definition.

[Structure Definition 1]

The following formula (1) is satisfied.

$$\oint_V \Gamma(V) dV \cong ni \quad (1)$$

where v is the volume of a drain layer, $\Gamma(v)$ is the activated impurity concentration in the drain layer, ni is the activated impurity concentration in intrinsic semiconductor Si ($ni \approx 10^{11}$ cm$^{-3}$), and "$\cong ni$" corresponds to the activated impurity concentration in the I layer of a PIN diode ("$\cong ni$"$\approx 10^{11}$ to $10^{15}$ cm$^{-3}$)

And the following formula (2) is also satisfied.

$$E_{(BV_{DSS})} < E_{crit} \text{ for } \forall V \quad (2)$$

This is alterable to the following formulas (3) and (4).

$$\int_{\vec{r}} P(\vec{r}) d\vec{r} < Q_{crit} \quad (3)$$

$$\int_{\vec{r}} N(\vec{r}) d\vec{r} < Q_{crit} \quad (4)$$

where $\vec{r}$ is the directional vector of the drain layer in a microscopic-aspect, $P(\vec{r})$ is the activated p-type impurity concentration in the drain layer, $N(\vec{r})$ is the activated n-type impurity concentration in the drain layer, $E_{crit} = 2 \times 10^5$ [v/cm], $Q_{crit} = 1.5 \times 10^{12}$ [/cm$^2$], and $BV_{DSS}$ is the maximum electric field intensity at a junction when a breakdown voltage is applied to a device.

However, MOSFETs having the structure described above entail a problem involving a difficulty in controlling the impurity profile in the n-drain layer. More specifically, in order to realize the RESURF principal, it is necessary to satisfy the following conditions. First, the activated impurity concentration in the n-drain layer, which comes from an offset between a p-type impurity and an n-type impurity, needs to be close to the activated impurity concentration in the I (intrinsic) layer of a PIN diode. In the Structure Definition 1, the activated impurity concentration in the I layer is denoted by "$\cong ni$". Furthermore, in a reverse bias state, all the regions in the n-drain layer are completely depleted and the electric field intensity E satisfies $E < E_{crit}$ in all the regions. Note that $E_{crit}$ mentioned above and also shown in the Structure Definition 1 denotes an electric field intensity at which an avalanche starts in Si.

As described above, although an attempt has been made to provide a device with both of a high breakdown voltage and a low ON-resistance, the prior art entails a problem that there is a difficulty in controlling the impurity profile in the n-drain layer to realize the RESURF principal.

BRIEF SUMMARY OF THE INVENTION

An object of the present invention is to provide a semiconductor device and a manufacturing method thereof, which can realize the RESURF principal without controlling the impurity profile in a semiconductor layer, and can easily obtain both of a high breakdown voltage and a low ON-resistance.

According to a first aspect of the present invention, there is provided a semiconductor device comprising:
  a first semiconductor layer of a first conductivity type;
  a second semiconductor layer of the first conductivity type having an impurity concentration lower than that of the first semiconductor layer, and disposed on the first semiconductor layer;
  a third semiconductor layer of a second conductivity type, formed in a surface of the second semiconductor layer on a side reverse to the first semiconductor layer;
  a fourth semiconductor layer of the first conductivity type formed in a surface of the third semiconductor layer;
  a gate electrode facing, through a gate insulating film, a surface of the third semiconductor layer between the second and fourth semiconductor layers;
  a first electrode electrically connected to the fourth semiconductor layer;
  a second electrode electrically connected to the first semiconductor layer, such that the second semiconductor layer is sandwiched between the first and second electrodes; and
  a plurality of hetero regions having a dielectric constant higher than that of the second semiconductor layer, and disposed in the second semiconductor layer between the first and second electrodes.

According to a second aspect of the present invention, there is provided a MISFET comprising:
  a drain layer of a first conductivity type having first and second sides reverse to each other;
  a base layer of a second conductivity type disposed on the drain layer on the first side;
  a source layer of a first conductivity type disposed on the base layer;

a gate electrode facing, through a gate insulating film, a
channel region, which is part of the base layer between
the drain and source layers;

a source electrode electrically connected to the source
layer;

a drain electrode electrically connected to the drain layer
on the second side, such that the drain layer is sandwiched between the source and drain electrodes; and a plurality of hetero regions having a dielectric constant
higher than that of the drain layer, and disposed in the
drain layer between the source and drain electrodes, the
hetero regions being arranged to lower an electric field
in the drain layer when a reverse bias is applied
between the source and drain electrodes, thereby
improving a breakdown voltage of the MISFET, as
compared to a case where no hetero regions are formed.

According to a third aspect of the present invention, there
is provided a method of manufacturing a semiconductor
device according to the first aspect wherein the hetero
regions comprise hollow portions formed in the second
semiconductor layer, comprising:

a first step of forming a first epitaxial layer of the first
conductivity type on the first semiconductor layer;

a second step of forming a plurality of trenches in a
surface of the first epitaxial layer;

a third step of closing upper portions of the trenches by
performing hydrogen annealing, thereby forming a
plurality of hollow portions; and a fourth step of forming a second epitaxial layer of the
first conductivity type on the first epitaxial layer with
the hollow portions formed therein.

By the semiconductor device and the manufacturing
method thereof, according to the present invention, it is
possible to control the average concentration of the second
semiconductor layer or the drain layer to be "≡ni" without
controlling the impurity profile. Consequently, the electric
field in the bulk of the second semiconductor layer or the
drain layer is lowered to a level where it does not cause an
avalanche in effect, when a reverse bias is applied.

Additional objects and advantages of the invention will be
set forth in the description which follows, and in part will be
obvious from the description, or may be learned by practice
of the invention. The objects and advantages of the invention
may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in
and constitute a part of the specification, illustrate presently
preferred embodiments of the invention, and together with
the general description given above and the detailed description of the preferred embodiments given below, serve to
explain the principles of the invention.

DETAILED DESCRIPTION OF THE INVENTION

Figure 1:
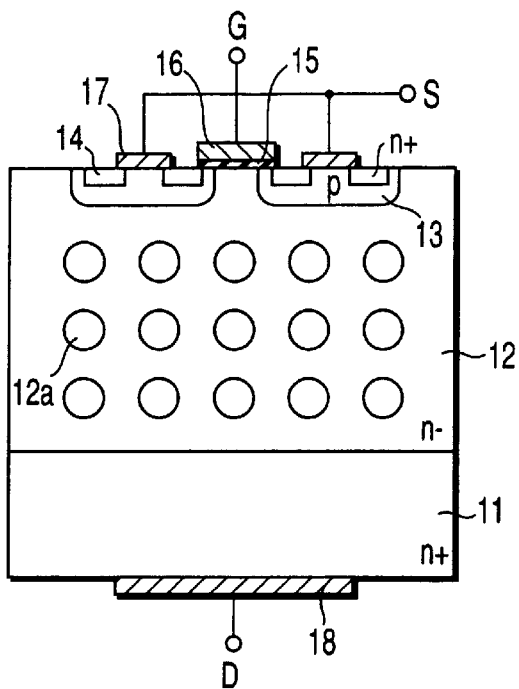
FIG. 1 is a sectional view schematically showing a power
MOSFET according to a first embodiment of the present
invention.

The embodiments of the present invention will be
described hereinafter with reference to the accompanying
drawings. In the following description, the constituent elements having substantially the same function and arrangement are denoted by the same reference numerals, and a
repetitive description will be made only when necessary.

[First Embodiment]

FIG. 1 is a sectional view schematically showing a power
MOSFET according to a first embodiment of the present
invention.

The power MOSFET shown in FIG. 1 includes an
$n^+$-silicon substrate (first semiconductor layer of a first
conductivity type) 11 to be used as a drain contact layer. An
$n^-$-silicon epitaxial layer (second semiconductor layer of the
first conductivity type) 12 to be used as a drain or collector
layer is formed on the substrate 11. A p-impurity diffusion
layer (third semiconductor layer of a second conductivity
type) 13 to be used as a base layer is selectively formed in
the surface of the drain layer. An $n^+$-impurity diffusion layer
(fourth semiconductor layer of the first conductivity type) 14
to be used as a source layer is selectively formed in the
surface of the base layer 12. The base layer 12 and the source
layer 14 are formed to be lines or rectangular rings.

A gate electrode 16 made of, e.g., polycrystalline silicon
is disposed to face, through a gate insulating film (gate oxide
film) 15, a channel region consisting of that portion of the
base layer 13, which is interposed between the drain layer 12
and the source layer 14. A source electrode 17 is disposed to
come into electrical contact with the base layer 13 and the
source layer 14. A drain electrode 18 is disposed to come
into electrical contact with the substrate (drain contact layer)
11. Consequently, the power MOSFET takes a form of the
vertical type, in which the drain layer 12 is sandwiched
between the source and drain electrodes 17 and 18.

A plurality of hollow portions 12a used as hetero regions
having a dielectric constant higher than that of the drain
layer 12 are formed and arrayed in the drain layer 12
between the source and drain electrodes 17 and 18. In other
words, the drain layer 12 constitutes a hetero-type n-buffer
structure with the hollow portions 12a dispersed therein. The
hetero regions formed of the hollow portions 12a are
arranged to lower the electric field in the drain layer 12 when
a reverse bias is applied between the source and drain
electrodes 17 and 18, thereby improving the breakdown
voltage of the power MOSFET, as compared to a case where
no hetero regions are formed.

For example, the hollow portions 12a are formed during
a process of epitaxially growing silicon (Si) of the drain
layer 12. More specifically, a first epitaxial layer is grown,
and then is provided with trenches of sub-micron dimension
formed therein. Then, the first epitaxial layer is subjected to
hydrogen annealing, thereby urging migration of surface
atoms to close the upper openings of the trenches. As a
result, each of the hollow portions 12a is formed of a trench
with a closing portion, which closes the upper portion of the
trench. The same steps are repeated to sequentially stack a
plurality of epitaxial layers, so that the drain layer 12 is
formed to have therein the hollow portions 12a arrayed in
vertical and horizontal directions.

An explanation will be given in more detail of a method
of forming the drain layer 12, taking a power MOSFET of
500V-series breakdown voltage as an example.

At first, a first epitaxial layer is formed on an $n^+$-silicon
substrate 11, using an epitaxial growth apparatus of the
single-wafer-processing type, for example. For the first
epitaxial layer, an Si film having a thickness of about 10 μm
and an n-type impurity concentration of about $1\times10^{15}$ $cm^3$ is
grown at a temperature of about 1,000° C.

Then, an oxide film having a thickness of about 500 nm is formed on the surface of the first epitaxial layer by means of CVD. The oxide film is sequentially patterned by means of dry etching, so that a plurality of openings having a size of, e.g., about 1 mm square. At this time, the opening pattern is formed such that the surface area ratio of the openings is 30% or less.

Then, using the oxide film with the openings as a mask, trenches are formed in the first epitaxial layer by means of RIE and so forth. For example, each of the trenches has a size of about 0.6 μm square and a depth of about 1 μm.

Then, after the oxide film is removed, a reducing treatment with hydrogen is performed at a temperature of 800° C. or more to remove a natural oxide film formed on the first epitaxial layer, using the epitaxial growth apparatus. At this time, migration of surface atoms is effected to close the upper openings of the trenches, thereby forming a plurality of hollow portions.

Then, a second epitaxial layer is formed on the first epitaxial layer, using the epitaxial growth apparatus. Also for the second epitaxial layer, an Si film having a thickness of about 10 μm and an n-type impurity concentration of about $1 \times 10^{15}$ /cm$^3$ is grown at a temperature of about 1,000° C. Then, the second epitaxial layer is subjected to the same sequential steps as described above.

Furthermore, a third epitaxial layer is grown under the same conditions and steps as in the first and second epitaxial layers. As a result, the drain layer 12 of a power MOSFET of 500V-series breakdown voltage is formed to have therein the hollow portions 12a. In this case, unlike the structure shown in FIG. 2, the hollow portions 12a are arrayed in two horizontal directions.

The size, number, positions, and so forth of the hollow portions 12a functioning as hetero regions having a high dielectric constant are decided on the basis of the necessary characteristics of a device, such as breakdown voltage and ON-resistance. The hetero regions, however, need to have a substantial size. Accordingly, each of the hetero regions (hollow portions 12a) has a length of from 0.1 to 100 μm, preferably of from 0.5 to 50 μm, and more preferably of from 1 to 10 μm, in each of a first direction connecting the source and drain electrodes 17 and 18, and second and third directions perpendicular to the first direction.

The drain layer 12 with such hollow portions 12a can have an impurity concentration about ten times or more larger than that of an ordinary epitaxial layer. The hollow portions 12a has a dielectric constant twelve times larger than that of Si, and thus the insulator breakdown is expected to be a hundred times or more the $E_{crit}$ described previously.

In a macroscopic-aspect, an I layer, such as a low-impurity-concentration layer, in the drain layer 12 of a hetero-type n-buffer structure can increase the insulator breakdown strength while reducing the resistance. In other words, such an I layer is like a new material equal to SiC or the like, which has an $E_{crit}$ ten times larger than that of Si. Where SiC is used for the I layer, the width of the I layer is reduced to about one-tenth in a reverse bias state, while the resistance of the I layer is reduced to less than one-tenth in a forward bias state.

The structure in this case is constituted on the basis of the following definition.

[Structure Definition 2]

The following formula (5) is satisfied.

$$\textit{f}_V \Gamma(V) + \rho(V) dV' \cong ni \quad (5)$$

where $v' = v - v_{hetero}$, $v_{hetero}$ is the volume of non-Si regions or hetero regions in a drain layer, and $\rho(v)$ is the charge distribution in the non-Si regions.

Accordingly, the following formula (6) or (7) is derived, and thus the RESURF principal can be extended.

$$Q'_{crit} \simeq \frac{\int_{\vec{r}} \{p(\vec{r}) + \rho(\vec{r})\} d\vec{r}}{|\vec{r}|} > Q_{crit} \quad (6)$$

$$Q'_{crit} \simeq \frac{\int_{\vec{r}} \{N(\vec{r}) + \rho(\vec{r})\} d\vec{r}}{|\vec{r}|} > Q_{crit} \quad (7)$$

As a result, the following result (8) is expected to be obtained.

$$Q'_{crit} > Q_{crit} \Rightarrow E'_{crit} > E_{crit} \quad (8)$$

As described above, the hollow portions 12a formed in the drain layer 12 makes it possible to control the average concentration of the drain layer 12 to be "≅ni" without controlling the impurity profile. Consequently, the electric field in the bulk of the drain layer 12 is lowered to a level where its Si does not cause an avalanche in effect, when a reverse bias is applied. As a result, the RESURF principal is realized in the device without relying on any complicated control of the impurity profile, thereby easily obtaining both of a high breakdown voltage and a low ON-resistance.

[Second Embodiment]

Figure 2:
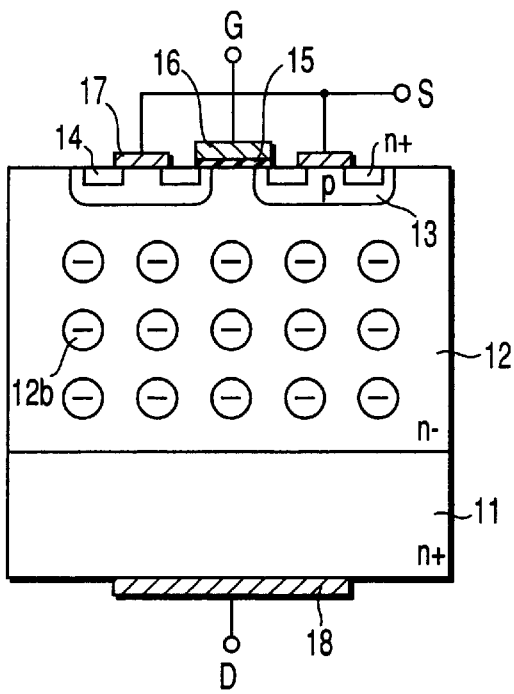
FIG. 2 is a sectional view schematically showing a power
MOSFET according to a second embodiment of the present
invention.
Figure 3:
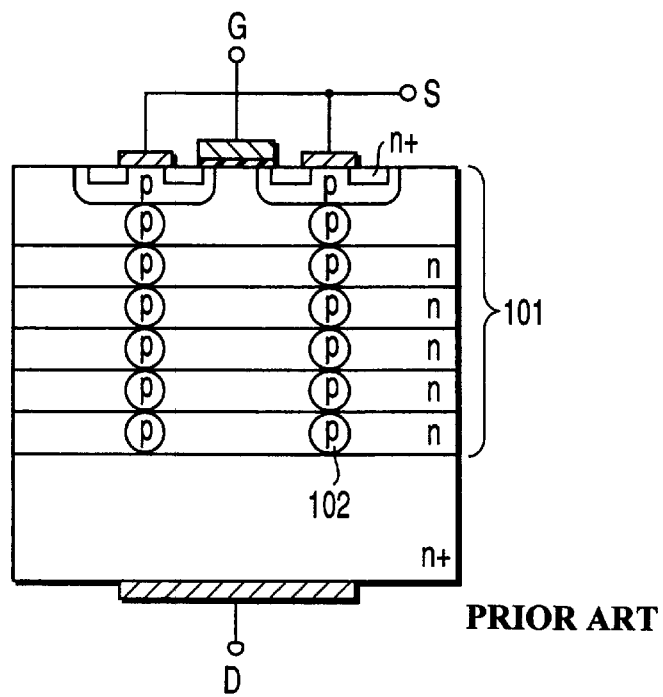
FIG. 3 is a sectional view schematically showing a power
MOSFET, to explain a conventional structure and problems
thereof.

FIG. 2 is a sectional view schematically showing a power MOSFET according to a second embodiment of the present invention. This embodiment differs from the first embodiment in that a plurality of solid dielectric layers 12b are formed as hetero regions having a high dielectric constant, in place of the hollow portions 12a.

As shown in FIG. 2, the solid dielectric layers 12b used as hetero regions having a dielectric constant higher than that of the drain layer 12 are formed and arrayed in the drain layer 12 between source and drain electrodes 17 and 18. In other words, the drain layer 12 constitutes a hetero-type n-buffer structure with the dielectric layers 12b having a higher dielectric constant and dispersed therein. The dielectric layers 12b have, e.g., an electrically negative fixed charge (−) The hetero regions formed of the dielectric layers 12b are arranged to lower the electric field in the drain layer 12 when a reverse bias is applied between the source and drain electrodes 17 and 18, thereby improving the breakdown voltage of the power MOSFET, as compared to a case where no hetero regions are formed.

As described above, the dielectric layers 12b formed in the drain layer 12 makes it possible to control the average concentration of the drain layer 12 to be "≅ni" without controlling the impurity profile. Consequently, the electric field in the bulk of the drain layer 12 is lowered to a level where its Si does not cause an avalanche in effect, when a reverse bias is applied. As a result, the RESURF principal is realized in the device without relying on any complicated control of the impurity profile, thereby easily obtaining both a high breakdown voltage and a low ON-resistance. In this case, the dielectric layers may consist of porous silicon layers or the like.

The present invention is applied to a power MOSFET, which has a gate insulating film of an oxide film, in the embodiments described above, but may be applied to a MISFET, which has a gate insulating film of a material other than the oxide film. The present invention is applied to a case where a gate electrode is disposed on the surface of a substrate, in the embodiments described above, but may be applied to a case where a gate electrode is disposed in a trench in a substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor layer of a first conductivity type;
   a second semiconductor layer of the first conductivity type having an impurity concentration lower than that of the first semiconductor layer, and disposed on the first semiconductor layer;
   a third semiconductor layer of a second conductivity type, formed in a surface of the second semiconductor layer on a side reverse to the first semiconductor layer;
   a fourth semiconductor layer of the first conductivity type formed in a surface of the third semiconductor layer;
   a gate electrode facing, through a gate insulating film, a surface of the third semiconductor layer between the second and fourth semiconductor layers;
   a first electrode electrically connected to the fourth semiconductor layer;
   a second electrode electrically connected to the first semiconductor layer, such that the second semiconductor layer is sandwiched between the first and second electrodes; and
   a plurality of hetero regions having a dielectric constant higher than that of the second semiconductor layer, and disposed in the second semiconductor layer at positions located between the second electrode and a pn junction between the second and third semiconductor layers, and out of contact with the pn junction.

2. The device according to claim 1, wherein the first electrode is also electrically connected to the third semiconductor layer.

3. The device according to claim 1, wherein the hetero regions comprise hollow portions formed in the second semiconductor layer.

4. The device according to claim 3, wherein each of the hollow portions comprises a trench formed in the second semiconductor layer during formation of the second semiconductor layer, and a closing portion formed by hydrogen annealing to close an upper portion of the trench.

5. The device according to claim 1, wherein each of the hetero regions comprises a solid dielectric layer.

6. The device according to claim 5, wherein the dielectric layers have an electrically negative fixed charge.

7. The device according to claim 5, wherein the dielectric layers comprise porous silicon layers.

8. The device according to claim 1, wherein the fourth semiconductor layer has an impurity concentration higher than that of the second semiconductor layer.

9. The device according to claim 1, wherein the first semiconductor layer consists essentially of a silicon substrate, and the second semiconductor layer consists essentially of a silicon epitaxial layer formed on the silicone substrate.

10. The device according to claim 1, wherein the semiconductor device constitutes a FET in which the first to fourth layers are a drain contact layer, a drain layer, a base layer having a channel region, and a source layer, respectively.

11. The device according to claim 1, wherein each of the hetero regions has a length of from 0.1 to 100 $\mu$m, in each of a first direction connecting the first and second electrodes, and second and third directions perpendicular to the first direction.

12. The device according to claim 1, wherein the hereto regions are disposed out of contact with an interface between the first and second semiconductor layers.

13. A MISFET comprising:
   a drain layer of a first conductivity type having first and second sides reverse to each other;
   a base layer of a second conductivity type disposed on the drain layer on the first side;
   a source layer of a first conductivity type disposed on the base layer;
   a gate electrode facing, through a gate insulating film, a channel region, which is part of the base layer between the drain and source layers;
   a source electrode electrically connected to the source layer;
   a drain electrode electrically connected to the drain layer on the second side, such that the drain layer is sandwiched between the source and drain electrodes; and
   a plurality of hereto regions having a dielectric constant higher than that of the drain layer, and disposed in the drain layer at positions located between the drain electrode and a pn junction between the drain layer and the base layer, and out of contact with the pn junction, the hetero regions being arranged to lower an electric field in the drain layer when a reverse bias is applied between the source and drain electrodes, thereby improving a breakdown voltage of the MISFET, as compared to a case where no hetero regions are formed.

14. The MISFET according to claim 13, further comprising a drain contact layer of the first conductivity type disposed between the second side of the drain layer and the drain electrode.

15. The MISFET according to claim 13, wherein the hetero regions comprise hollow portions formed in the drain layer.

16. The MISFET according to claim 15, wherein each of the hollow portions comprises a trench formed in the drain layer during formation of the drain layer, and a closing portion formed by hydrogen annealing to close an upper portion of the trench.

17. The MISFET according to claim 13, wherein each of the hetero regions comprises a solid dielectric layer.

18. The MISFET according to claim 17, wherein the dielectric layers have an electrically negative fixed charge.

19. The MISFET according to claim 17, wherein the dielectric layers comprise porous silicon layers.

20. The MISFET according to claim 13, wherein each of the hetero regions has a length of from 0.1 to 100 $\mu$m, in each of a first direction connecting the source and drain electrodes, and second and third directions perpendicular to the first direction.

* * * * *